United States Patent
Shah et al.

(10) Patent No.: US 10,685,730 B1
(45) Date of Patent: Jun. 16, 2020

(54) CIRCUIT INCLUDING EFFICIENT CLOCKING FOR TESTING MEMORY INTERFACE

(71) Applicant: Seagate Technology LLC, Cupertino, CA (US)

(72) Inventors: Komal Shah, Maharashtra (IN); Jay Shah, Gujarat (IN); Sachin Bastimane, Maharashtra (IN)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/926,414

(22) Filed: Mar. 20, 2018

(51) Int. Cl.
  *G11C 29/38* (2006.01)
  *G11C 29/12* (2006.01)
  *G01R 31/317* (2006.01)
  *G01R 31/3187* (2006.01)
  *G11C 29/04* (2006.01)

(52) U.S. Cl.
  CPC .......... *G11C 29/38* (2013.01); *G01R 31/3187* (2013.01); *G01R 31/31725* (2013.01); *G11C 29/12015* (2013.01); *G11C 2029/0401* (2013.01)

(58) Field of Classification Search
  CPC .............. G11C 29/38; G11C 29/12015; G11C 2029/0401; G01R 31/31725; G01R 31/3187
  USPC .................................................. 714/718, 733
  See application file for complete search history.

(56) References Cited

U.S. PATENT DOCUMENTS

| | | |
|---|---|---|
| 5,568,437 A | 10/1996 | Jamal |
| 6,349,398 B1 | 2/2002 | Resnick |
| 6,681,359 B1 | 1/2004 | Au et al. |
| 6,728,916 B2 | 4/2004 | Chen et al. |
| 6,978,411 B2 | 12/2005 | Huang et al. |
| 6,981,191 B2 | 12/2005 | Dorsey |
| 6,996,760 B2 | 2/2006 | Dorsey |
| 7,260,759 B1 | 8/2007 | Zarrineh et al. |
| 7,340,658 B2 | 3/2008 | Seuring |

(Continued)

OTHER PUBLICATIONS

Kaushal et al., Article "MBIST Verification: Best practices and Challenges", How to Article, 2014, 14 pages.https://www.edn.com/design/integrated-circuit-design/4432284/MBIST-verification—Best-practices—challenges.

(Continued)

*Primary Examiner* — James C Kerveros

(74) *Attorney, Agent, or Firm* — Setter Roche LLP; Kirk A. Cesari

(57) ABSTRACT

In some embodiments, an integrated circuit may include a memory self-testing circuit and a memory having a plurality of data storage locations, each location having a unique address. The integrated circuit may further include an output including at least one register capable of storing an address of a memory location where an error has been detected during execution of the memory self-testing circuit. Further, the integrated circuit may include an on-chip clock controller (OCC) circuit including a first output to provide a first clock signal and a second output to provide a second clock signal according to a mode of operation. In a scan mode, the OCC circuit may be configured to enable the first clock signal and the second clock signal and to selectively enable the first clock signal and the second clock signal to be mutually exclusive during a scan capture portion of the scan mode.

20 Claims, 7 Drawing Sheets

(56) References Cited

U.S. PATENT DOCUMENTS

| | | |
|---|---|---|
| 7,346,820 B2 * | 3/2008 | Padhye .......... G01R 31/318541 |
| | | 714/726 |
| 7,426,668 B2 | 9/2008 | Mukherjee et al. |
| 7,444,560 B2 * | 10/2008 | Nguyen ........... G01R 31/31721 |
| | | 365/201 |
| 7,475,312 B2 * | 1/2009 | Van Kaam ......... G01R 31/3187 |
| | | 714/733 |
| 7,617,425 B2 | 11/2009 | Nadeau-Dostie et al. |
| 7,653,845 B2 | 1/2010 | Hesse et al. |
| 7,653,854 B2 | 1/2010 | Anzou et al. |
| 7,721,174 B2 | 5/2010 | Cheng et al. |
| 7,814,385 B2 | 10/2010 | Bahl |
| 7,870,454 B2 * | 1/2011 | Gorman ................. G11C 29/40 |
| | | 714/719 |
| 8,239,818 B1 | 8/2012 | Monroe et al. |
| 8,566,658 B2 | 10/2013 | Tekumalla et al. |
| 8,671,320 B2 | 3/2014 | Tekumalla |
| 8,984,354 B2 | 3/2015 | Kuo et al. |
| 8,990,623 B2 | 3/2015 | Eaton et al. |
| 9,436,567 B2 | 9/2016 | Gorti et al. |
| 9,689,919 B2 | 6/2017 | Zhao et al. |
| 2006/0146622 A1 | 7/2006 | Mukherjee et al. |
| 2009/0125763 A1 | 5/2009 | Chang et al. |
| 2013/0275824 A1 | 10/2013 | Tekumalla et al. |
| 2016/0306010 A1 | 10/2016 | Li |

OTHER PUBLICATIONS

Lin, Article "Low Power Testing—What Can Commercial Design-for-Test Tools Provide?", J. Low Power Electron. Appl., 2011, 16 pages.

* cited by examiner

FIG. 6A — FUNCTIONAL MODE (600)

- Scan Enable = 0
- Func or NOT Mbist = 1
- TCLK = 0
- BISTCLK = 0
- Func CLK (clocking)
- Mbist CLK (idle)

FIG. 6B — MBIST MODE (610)

- Scan Enable = 0
- Func or NOT Mbist = 0
- TCLK = 1
- BISTCLK = 1
- Func CLK (idle)
- Mbist CLK (clocking)

FIG. 6C — SCAN MODE (620)

Scan Shift — 622 Scan Capture — Scan Shift — 624 Scan Capture — 626

- Scan Enable
- Func or NOT MBist
- TCLK = 0
- BISTCLK = 0
- Func CLK
- Mbist CLK

CIRCUIT INCLUDING EFFICIENT CLOCKING FOR TESTING MEMORY INTERFACE

SUMMARY

In some embodiments, an integrated circuit may include a memory self-testing circuit and a memory having a plurality of data storage locations, each location having a unique address. The integrated circuit may further include an output including at least one register capable of storing an address of a memory location where an error has been detected during execution of the memory self-testing circuit. Further, the integrated circuit may include an on-chip clock controller (OCC) circuit including a first output to provide a first clock signal and a second output to provide a second clock signal according to a mode of operation. In a scan mode, the OCC circuit may be configured to enable the first clock signal and the second clock signal. In a scan capture mode, the OCC circuit may be configured to selectively enable the first clock signal and the second clock signal to be mutually exclusive.

In other embodiments, an integrated circuit may include a memory having a plurality of data storage locations, where each location has a unique address. The integrated circuit may further include a memory self-testing circuit and an on-chip clock controller (OCC) circuit including a first output to provide a first clock signal to the memory and a second output to provide a second clock signal to the memory self-testing circuit, the OCC circuit configured to selectively enable at least one of the first clock signal and the second clock signal to be mutually exclusive during a scan capture portion of a scan mode. The integrated circuit may further include an output including at least one register capable of storing an address of a memory location where an error has been detected during execution of the memory self-testing circuit.

In other embodiments, a method may include determining an operating mode of an on-chip clock control (OCC) circuit based on signals received at a plurality of inputs using a digital logic circuit of the OCC circuit. In a functional operating mode, the method may include providing a first clock signal to a first output using the OCC circuit to enable a functional logic circuit. In a memory built-in self-test mode, the method may include providing a second clock signal to a second output using the OCC circuit to enable a memory self-testing circuit to detect one or more errors in a memory having a plurality of data storage locations, where each location has a unique address. In a scan mode, the method can include automatically providing via the OCC circuit the first clock signal to the first output and the second clock signal to the second output, and, during a scan capture mode, selectively disabling via the OCC circuit one of the first clock signal and the second clock signal, automatically.

In some embodiments, memory devices may include test pins and functional pins, which may be asynchronous. Functional pins may be active during functional modes, and test pins may be active during memory built-in-self-test mode. However, both test pins and functional pins may be active during scan capture mode. Embodiments described below enable testing of the memory interface during scan capture mode while treating the functional and test pins as being asynchronous. The embodiments make it possible to perform a variety of tests without having to put in additional effort to close the timing between asynchronous paths. Further, embodiments may be configured to control excessive switching activity for memories in scan capture mode which switching activity may be more than functional activity.

BRIEF DESCRIPTION OF THE DRAWINGS

FIGS. 6A-6C depict timing diagrams of various signals of an OCC circuit during a functional mode, a memory built-in self-test mode, and a scan mode, respectively, in accordance with certain embodiments of the present disclosure.

In the following discussion, the same reference numbers are used in the various embodiments to indicate the same or similar elements.

DETAILED DESCRIPTION OF ILLUSTRATIVE EMBODIMENTS

As the complexity of logic circuitry and the densities of memory devices increases, circuit testing has become increasingly complex. Moreover, it can be difficult to determine the coverage provided by the tests. Additionally, the scan testing can take too much time.

Recent designs of memory devices may be dominated by memories and the digital logic in the design may interface extensively with the memories. The signal paths may be among the top critical paths in the design. Hence, testing of memory interface paths during scan operations to detect faults on these paths can be important. Many memory vendors provide memories with in-built scan features (e.g., integrated scan chains) to support testing the digital logic circuitry. Some of the advanced clocking methods used in memory devices can make it challenging for physical design and static timing analysis teams to time close these paths in scan mode.

Embodiments of circuits are described below that can be used to efficiently test digital paths in the circuit using input/output (I/O)-based, Joint Test Action Group (JTAG)-based, or User Test Data Register (UDR)-based inputs to control functional and memory built-in self-test (MBIST) clock modes to be mutually exclusive during a scan capture portion of a scan mode. This functionality makes it possible to target paths that are real in both functional and MBIST modes to detect faults during a scan mode operation, simplifying static timing analysis (STA) and the physical design implementation.

In some embodiments, the circuitry may allow testing of real, at-speed paths of the memory interface using built-in test circuitry. Further, the circuitry allows for testing without balancing the functional clock with the test clock and without masking violating paths during scan testing, thereby easing STA and physical design constraints to manage both functional and MBIST clocks. Additionally, the circuitry does not require toggling of the MBIST clock and the functional clock during scan capture mode.

Figure 1:
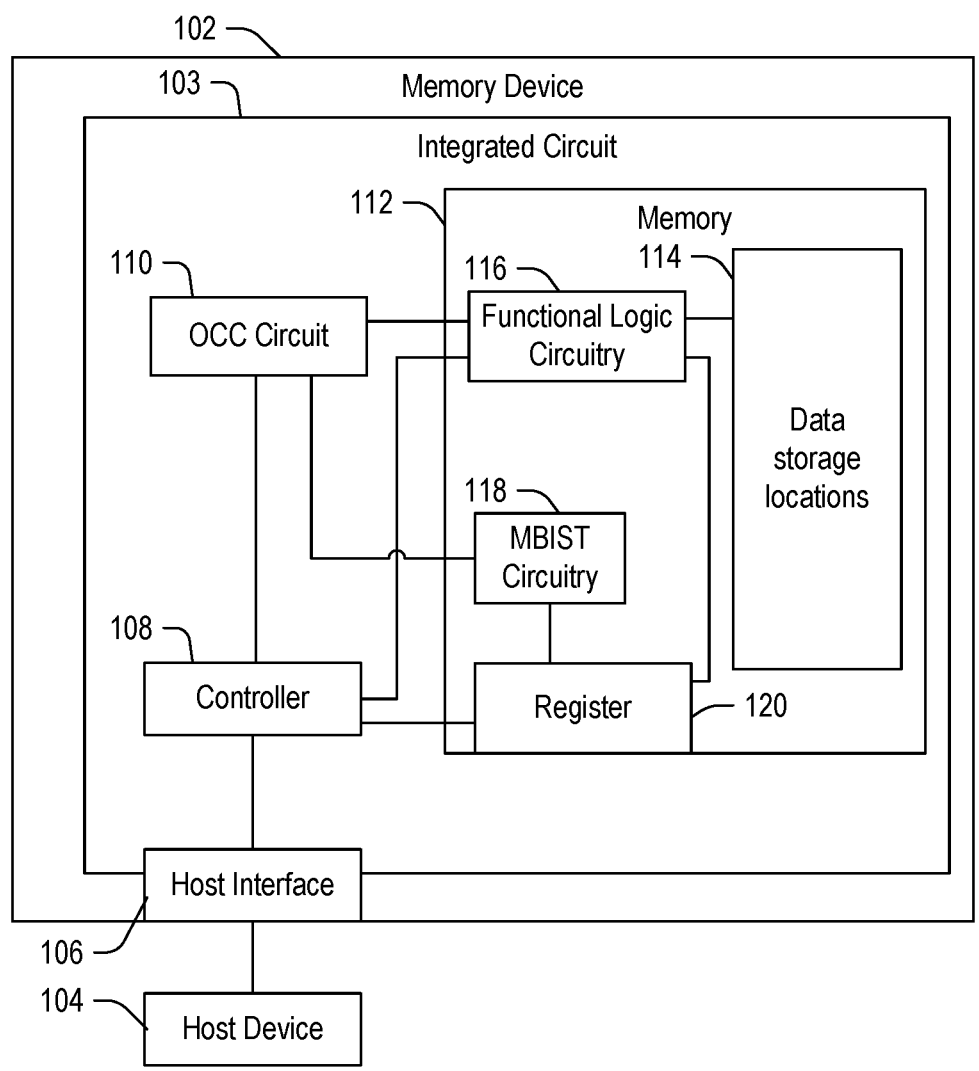
FIG. 1 depicts a block diagram of an apparatus including a memory device having an on-chip clock control (OCC) circuit configured to provide efficient clocking for a test memory interface, in accordance with certain embodiments of the present disclosure.

FIG. 1 depicts a block diagram of an apparatus 100 including a memory device 102 having an on-chip clock control (OCC) circuit 110 configured to provide efficient clocking for a test memory interface, in accordance with certain embodiments of the present disclosure. The memory device 102 may be configured to communicate with a host device 104, such as a computer processor or other, via a host interface 106, such as a serial attachment (SATA) interface, a parallel ATA interface, another memory interface, or any combination thereof.

The memory device 102 may include an integrated circuit 103, which may include the host interface 106. The integrated circuit 103 can include a controller 108 coupled to the host interface 106. The controller 108 may be configured to control operation of the memory device 102. In an example, the controller 108 may be configured to manage data retrieval and data storage operations for interacting with a physical memory 112, such as a solid state storage, a hard disc drive, an optical storage device, or any combination thereof. The controller 108 may be configured to execute firmware stored in a memory of the integrated circuit 103 and optionally to manage application of updates to the firmware. In some embodiments, the controller 108 may also manage communications between an external device and embedded test circuitry. In certain embodiments, the controller 108 may be implemented as a microcontroller unit (MCU), an application specific gate array circuit, a field programmable gate array circuit, another type of data processing circuit, or a combination of circuits configured to implement the functionality described herein.

In some embodiments, the memory 112 may include test pins and functional pins, which may be asynchronous. Functional pins may be active during functional modes, and test pins may be active during memory built-in-self-test mode. However, both test pins and functional pins may be active during scan capture mode. The memory device 102 may include circuitry configured to enable testing of the memory 112 during a scan capture mode, while treating the functional and test pins as being asynchronous. The memory device 102 allows for performance of a variety of tests without having to close the timing between asynchronous paths. Further, the memory device 102 may be configured to control excessive switching activity for memories in scan capture mode which switching activity may be more than functional activity.

The integrated circuit 103 may further include an on-chip controller (OCC) circuit 110 and a memory 112, such as a solid-state memory, a hard disc drive, an optical data storage, another type of memory, or any combination thereof. The OCC circuit 110 may be configured to provide a first clock signal (such as a functional clock signal) to functional logic circuitry 116 and to provide a second clock signal (such as a memory built-in self-test (MBIST) clock signal to MBIST circuitry 118. It should be appreciated that the functional logic circuitry 114 of the memory 112 may be accessed by one or more functional pins, and the MBIST circuitry 118 may be accessed by one or more test pins. The lines connecting the OCC circuit 110 to the functional logic circuitry 116 and the MBIST circuitry 118 may represent conductive pins, which may be accessed during manufacturing for testing purposes and which may be accessible to the OCC circuit 110 after manufacturing is complete.

The memory 112 may include a plurality of data storage locations 114, each location having a unique memory address. The memory 112 may further include one or more registers 120, which may be coupled to the MBIST circuitry 118 and to the functional logic circuitry 116. The one or more registers 120 may be coupled to the controller 108. The registers 120 may be configured to store an address of a memory location where an error has been detected during execution of the memory self-testing circuit.

In a functional mode, the OCC circuit 110 may provide a functional clock to the functional logic circuitry 116, and MBIST circuitry 118 may be disabled. In an MBIST mode, the OCC circuit 110 may provide an MBIST clock to the MBIST circuitry 118, and the functional logic circuitry 116 may be disabled. In a scan mode, the OCC circuit 110 may provide both the functional clock signal and the MBIST clock signal during a scan shift portion of a scan chain test mode. The OCC circuit 110 may selectively disable a selected one of the functional clock signal and the MBIST clock signal during a scan capture portion of the scan chain test mode.

In the illustrated example, the integrated circuit 103 includes circuitry configured to provide efficient clocking for testing of a memory interface. In an example, the OCC circuit 110 may be configured to selectively enable at least one of the functional clock signal and the MBIST clock signal to be mutually exclusive during a scan capture portion of a scan mode. Further, the functional logic circuitry 116 and the MBIST logic circuitry 118 may be responsive to the functional clock signal and the MBIST clock signal, such that the respective circuitry is active in response to the corresponding clock signal and deactivated or off when the clock signal is not present. Other embodiments are also possible.

It should be appreciated from the discussion below, with respect to FIGS. 2-7, that the selective application of the clock signals may be implemented using a variety of different logic circuits. One particular circuit is described below with respect to FIG. 1.

Figure 2:
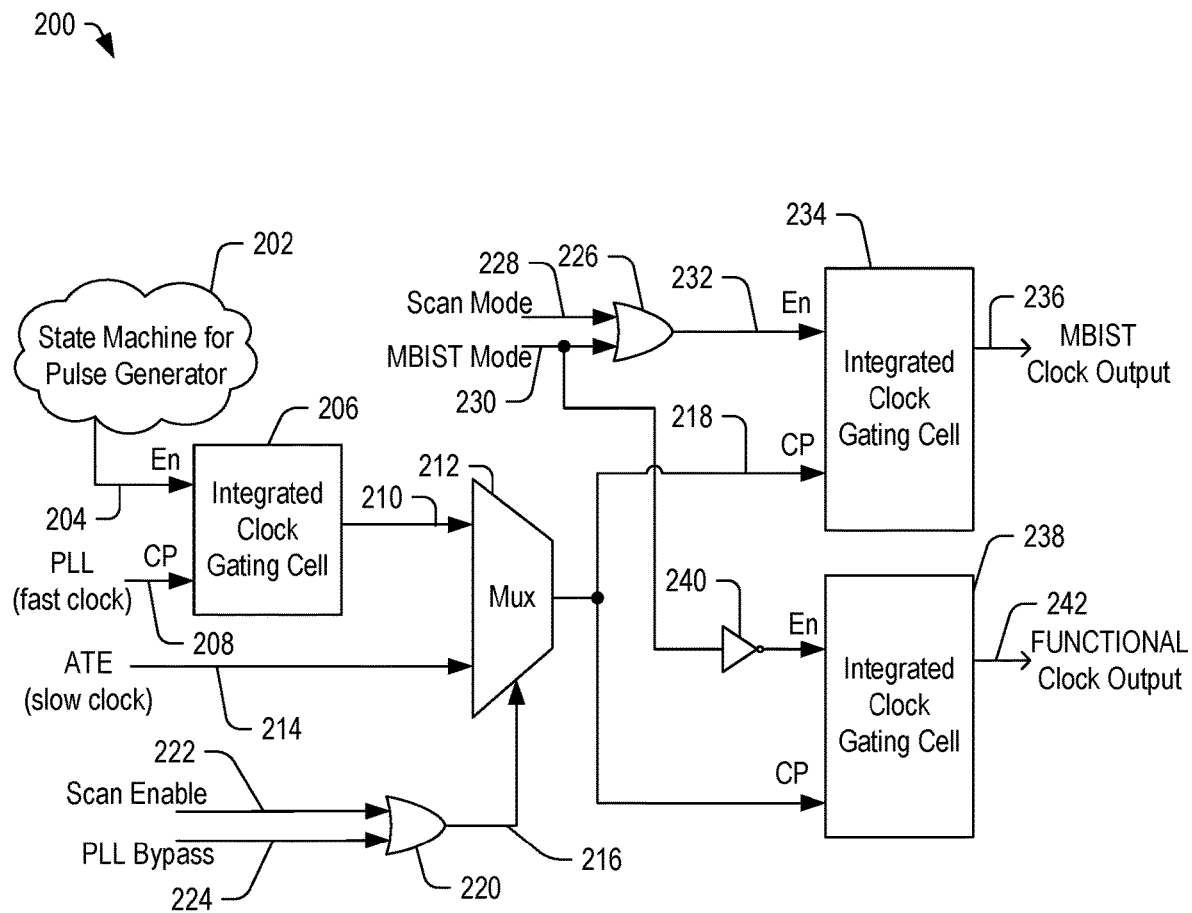
FIG. 2 depicts an OCC circuit configured to provide efficient clocking for a test memory interface, in accordance with certain embodiments of the present disclosure.

FIG. 2 depicts an OCC circuit 200 including clock control circuitry configured to provide efficient clocking for a test memory interface, in accordance with certain embodiments of the present disclosure. It should be appreciated that the OCC circuit 200 can be one possible example of the OCC circuit 110 of FIG. 1. The OCC circuit 200 may include state machine 202 configured to generate a time-varying signal, such as a clock pulse, which may be applied to a node 204. The OCC circuit 200 may further include an integrated clock gating cell 206 including an enable input coupled to the node 204, a clock pulse (CP) input coupled to a node 208 to receive a phase-locked loop (PLL) signal (such as a fast clock signal, and an output coupled to a node 210. The OCC circuit 200 may further include a multiplexer 212 including a first input coupled to the node 210, a second input coupled to a node 214 to receive an automatic test equipment (ATE) slow clock signal, an enable input coupled to a node 216, and an output coupled to a node 218.

The OCC circuit 200 may further include a logical OR gate 220 including a first input coupled to a first node 222 to receive a scan enable signal, a second input coupled to a second node 224 to receive a PLL bypass signal, and an output coupled to the node 216. The OCC circuit 200 may further include a logical OR gate 226 including a first input coupled to a node 228 to receive a scan mode signal, a second input coupled to a node 230 to receive an MBIST mode signal, and an output coupled to a node 232.

The OCC circuit 200 may also include an integrated clock gating cell 234 including an enable input coupled to the node 232, a clock pulse (CP) input coupled to the node 218, and an output coupled to a node 236 to provide an MBIST clock output signal. The OCC circuit 200 may further include an integrated clock gating cell 238 including an enable input coupled to a node 230 through an inverter 240, a clock pulse (CP) input coupled to the node 218, and an output coupled to the node 242 to provide a functional clock output.

In the illustrated example, the OCC circuit 200 may include separate clock gating latches for functional and MBIST clock branches towards output side. During operation of the OCC circuit 200, the MBIST logic may be disabled (or shut-off) during a functional mode, and the corresponding functional logic may also be disabled (or shut-off) in a memory built-in self-test (MBIST) mode, eventually saving power in each of the modes.

The embodiment of FIG. 2 represents one possible example of an OCC circuit to provide efficiently clocking for testing memory interface logic. Other embodiments are also possible.

Figure 3:
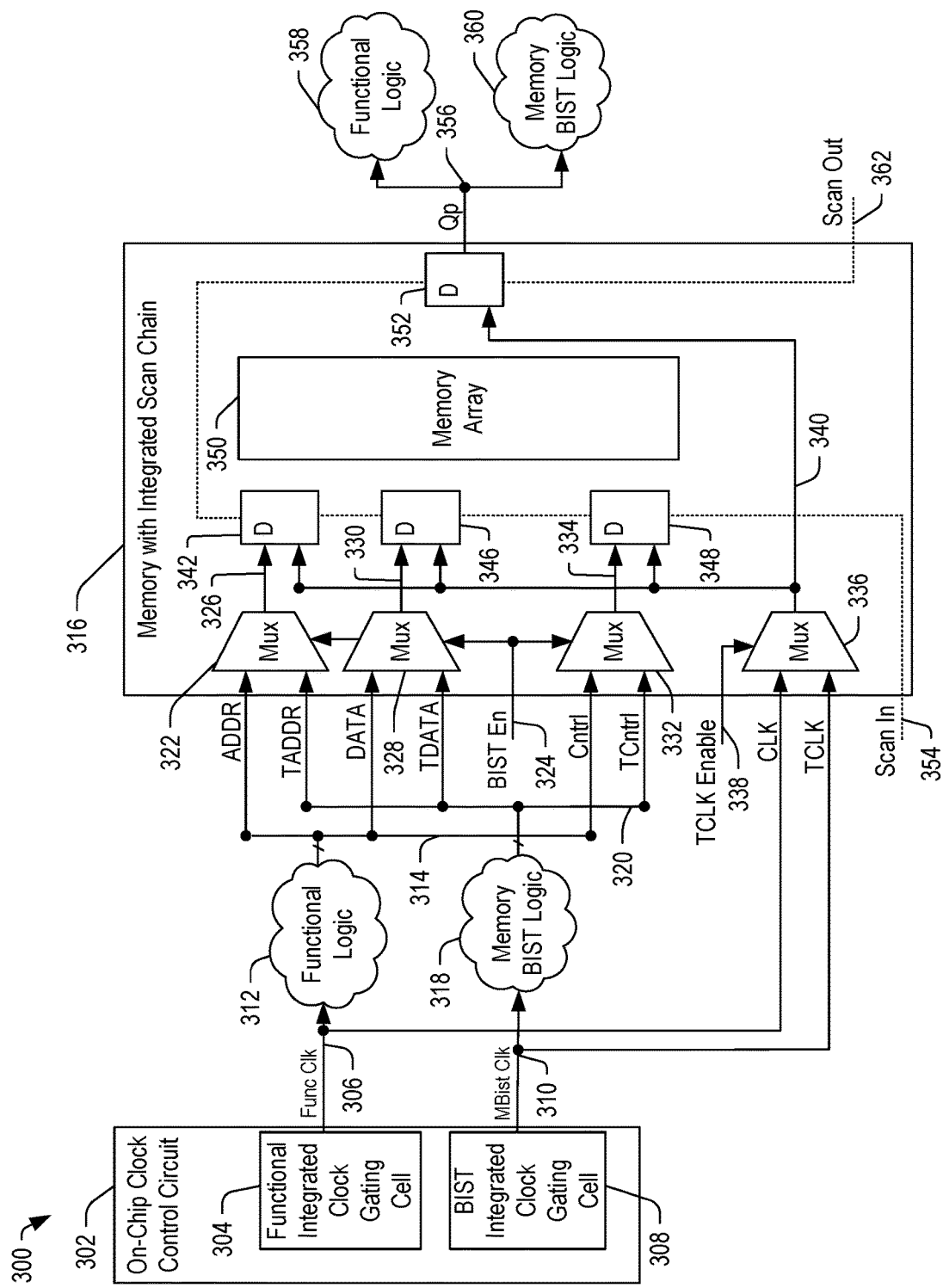
FIG. 3 depicts a circuit including an OCC circuit configured to provide efficient clocking for a test memory interface, in accordance with certain embodiments of the present disclosure.

FIG. 3 depicts a circuit 300 including an OCC circuit 302 configured to provide efficient clocking for a test memory interface, in accordance with certain embodiments of the present disclosure. It should be appreciated that the OCC circuit 302 can be one possible example of the OCC circuit 110 of FIG. 1. The OCC circuit 302 may include a functional integrated clock gating cell 304 including an output coupled to a node 306. The OCC circuit 302 may further include a built-in self-test integrated clock gating cell 308 including an output coupled to a node 310.

The circuit 300 may further include functional logic 312 including an input coupled to the node 306 and an output coupled to a node 314. The circuit 300 may also include memory built-in self-test (MBIST) logic 318 including an input coupled to the node 310 and an output coupled to a node 320.

The circuit 300 may further include a memory 316 with an integrated scan chain. The memory 316 may include a multiplexer 322 including a first input coupled to the node 314 to receive an address (ADDR), a second input coupled to the node 320 to receive a test address (TADDR), a select input coupled to a node 324 to receive a BIST enable signal, and an output coupled to a node 326. The memory 316 may further include a multiplexer 328 including a first input coupled to the node 314 to receive data, a second input coupled to the node 320 to receive test data, a control input coupled to the node 324 to receive the BIST enable signal, and an output coupled to a node 330. The memory 316 may also include a multiplexer 332 including a first input coupled to the node 314 to receive a control signal (Cntrl), a second input coupled to the node 320 to receive a test control signal (TCntrl), a control input coupled to the node 324 to receive the BIST enable signal, and an output coupled to a node 334. The memory 316 may further include a multiplexer 336 including a first input coupled to the node 306 to receive a functional clock signal, a second input coupled to the node 310 to receive an MBIST clock signal, a control input coupled to a node 338 to receive a test clock (TCLK) enable signal, and an output coupled to a node 340.

The memory 316 may further include a scan input node 354 to receive a scan in signal. The memory 316 may also include a latch circuit 342 including an input coupled to the node 326, a clock input coupled to the node 340, a control input coupled to the node 354, and an output. The memory 316 may further include a latch circuit 346 including an input coupled to the node 330, a clock input coupled to the node 340, and a control input coupled to the node 354. The memory 316 may also include a latch circuit 348 including an input coupled to the node 334, a clock input coupled to the node 340, and an input coupled to the node 354.

The memory 316 may further include a memory array 350. Additionally, the memory 316 may include a latch 352 including a first input, a clock input coupled to the node 340, a control input coupled to the node 354, a scan output coupled to a node 362, and an output coupled to a node 356. The circuit 300 may further include functional logic 358 coupled to the node 356 and memory BIST logic 360 coupled to the node 356.

In this example, the OCC circuit 200 may selectively disable one of the MBIST circuitry 318 and 360 and the functional logic circuitry 312 and 358, depending on the mode. Accordingly, the MBIST circuitry 318 and 360 and the functional logic circuitry 312 and 358 do not interact with each other and thus they can be treated as being mutually exclusive. Though the source (e.g., BIST integrated clock gating cell 308) for the MBIST clock (at the node 310) and the source (e.g., the functional integrated clock gating circuit 304) for the functional clock (at the node 306) may be the same (state machine 202 or another clock source), the functional logic path 312 and 358 and the MBIST path 318 and 360 do not need to be balanced. During a scan mode of operation, both the MBIST clock and the functional clock domains can be active to test both the functional logic 312 and the MBIST logic 318 using scan chains.

In a functional mode, the functional integrated clock gating cell 304 may provide the functional clock signal to the node 306 enabling the functional logic 312, and the BIST integrated clock gating cell 308 may be disabled (or turned off) disabling the MBIST logic 318, reducing power consumption. In this mode, the address, data, and control signals at the first inputs of the multiplexers 322, 328, and 332 are provided to the latches 342, 346, and 348 via the nodes 326, 330, and 334, respectively. In particular, only the data, address, and control paths are active in the functional mode of operation, and the functional clock at the node 306 is provided to the functional logic 312 and to the latch 352.

In a MBIST mode, the clock signal at the node 310 from the MBIST integrated clock gating circuit 308 from the OCC circuit 302 may drive the memory BIST logic 318 and take test paths via the test address, test data, test control, and test clock inputs. In this example, the functional integrated clock gating cell 304 may be disabled and the functional clock signal at the node 306 is turned off, saving power and allowing multiple memories to be tested in parallel.

In a scan mode, both the functional integrated clock gating cell 304 and the BIST integrated clock gating cell 308 are enabled, and the functional clock signal at the node 306 and the MBIST clock signal at the node 310 are on. In this example, the design using integrated test memory have memory paths between functional and BIST lines, which are observed only during the scan mode of operation. In this example, the MBIST clock signal and the functional clock signal may be asynchronous to each other. Since the paths of both the functional logic 312 and the MBIST logic 318 interact at the memory interface only during scan mode, the circuit 300 may include additional circuitry to balance the clocks or to mask violating paths during scan tests. However, balancing the clock signals may increase the physical design overhead. Masking the violating paths during scan tests can impact the scan coverage.

In one possible embodiment, during scan insertion/stitching, the functional and MBIST clock signals are considered as asynchronous. To prevent hold violations in interacting paths, the circuit 300 can insert lockup latches when scan cells cross from one domain to another.

In another possible embodiment, logic may be added to control enable signals from functional and MBIST clock gating latches such that only one of them is active at a given time. This scan capture (stuck-at and at speed) may ensure that even if there are paths between the functional logic domain and the MBIST logic domains, only one clock is active at a given time. In this case, there is no need to balance paths between these two clocks and the paths do not need to masked during scan capture.

In still another possible embodiment, during MBIST, functional address logic 312 may be bypassed via BIST input of memory. At times, memory internal scan chains are not used, and random access memory sequential patterns can be generated to test functional paths through memories.

Figure 4:
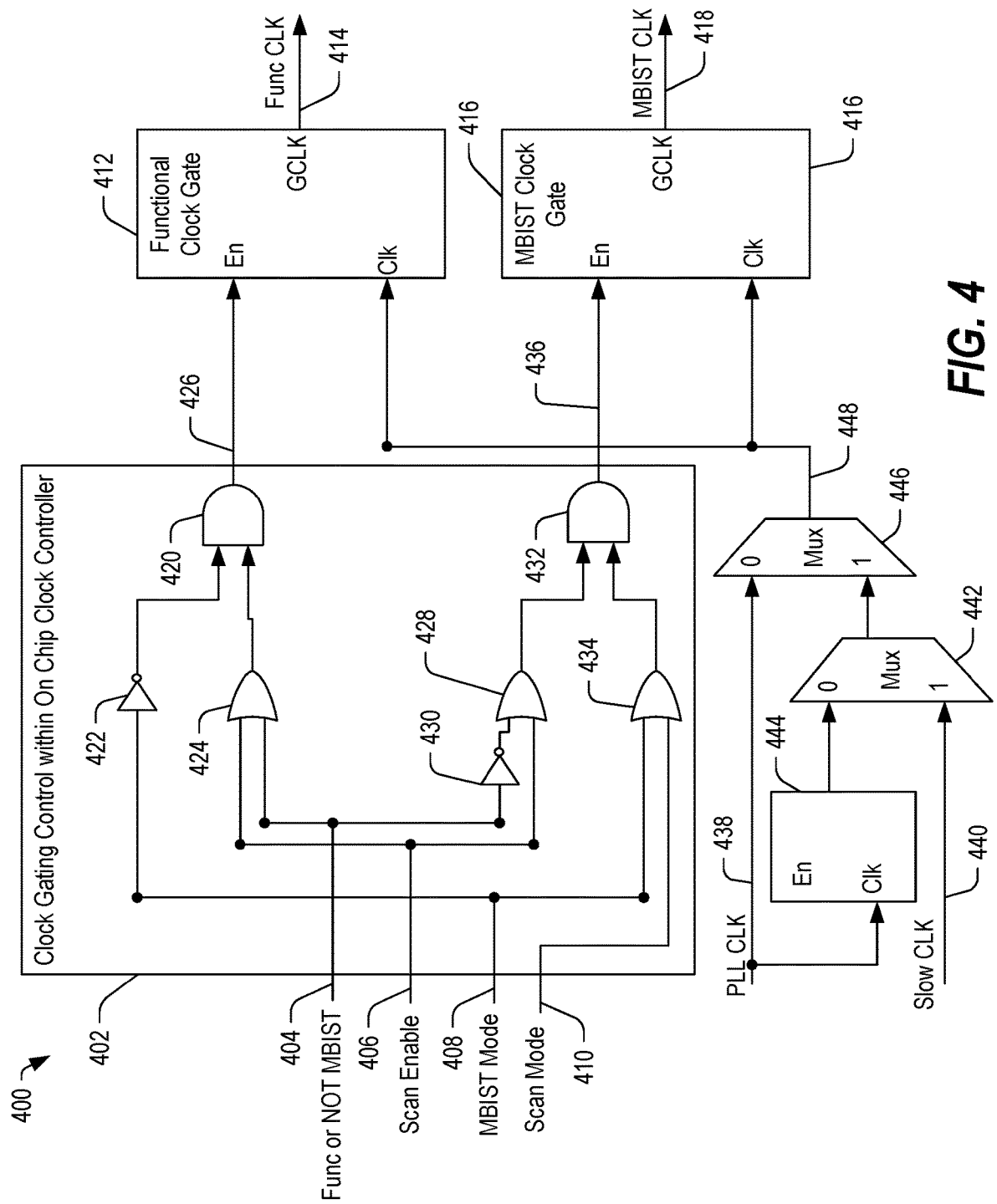
FIG. 4 depicts an OCC configured to provide efficient clocking for a test memory interface, in accordance with certain embodiments of the present disclosure.

FIG. 4 depicts an OCC circuit 400 configured to provide efficient clocking for a test memory interface, in accordance with certain embodiments of the present disclosure. It should be appreciated that the OCC circuit 400 can be one possible example of the OCC circuit 110 of FIG. 1. The OCC circuit 400 may include a clock gating control circuit 402 within the OCC circuit 400. The clock gating control circuit 402 may include a first input node 404 to receive a functional or NOT MBIST signal, a second input node 406 to receive a Scan Enable signal, a third input node 408 to receive an MBIST mode signal, and a fourth input node 410 to receive a Scan Mode signal.

The clock gating control circuit 402 may include a logical AND gate 420 including a first input coupled to the node 408 through an inverter 422, a second input coupled to an output of a logical OR gate 424, and an output coupled to a node 426. The logical OR gate 424 may include a first input coupled to the node 406 and a second input coupled to the node 404.

The clock gating control circuit 402 may further include a logical OR gate 428 including a first input coupled to the node 404 through an inverter 430, a second input coupled to the node 406, and an output coupled to a first input of a logical AND gate 432. The logical AND gate 432 may include a second input coupled to an output of a logical OR gate 434, and an output coupled to a node 436. The logical OR gate 434 may include a first input coupled to the node 408 and a second input coupled to the node 410.

The OCC circuit 400 may include a node 438 configured to receive a phase locked loop (PLL) signal and a node 440 to receive a slow clock signal. The OCC circuit 400 can include a latch 444 including an enable input, a clock input coupled to the node 438, and an output coupled to a first input of a multiplexer 442. The multiplexer 442 may include a second input coupled to the node 440 and an output. The OCC circuit 400 may also include a multiplexer 446 including a first input coupled to the node 438, a second input coupled to the output of the multiplexer 442, and an output coupled to a node 448.

The OCC circuit 400 can include a functional clock gate 412 including an enable input coupled to the node 426, a clock input coupled to the node 448, and an output 414 configured to provide a functional clock signal. The OCC circuit 400 may also include an MBIST clock gate 416 including an enable input coupled to the node 436, a clock input coupled to the node 448, and an output 418 to provide an MBIST clock signal.

In the illustrated example, the OCC circuit 400 can help to achieve both functional and MBIST goals together with scan shift and scan capture scenarios. The functional or NOT MBIST signal at the node 404 can be used to make functional and MBIST clocking mutually exclusive during the scan mode. The signal at the node 404 may be controlled from a top-level pin or a Joint Test Action Group (JTAG) data register (user data register or buffered data register). Other embodiments are also possible.

In the illustrated example, the clock gates 412 and 416 may be controlled by one of the PLL clock at the node 438 or the slow clock at the node 440. The output clock (either functional clock at the node 414 or the MBIST clock at the node 418) may be provided based on the functional or not MBIST signal at the node 404.

It should be appreciated that, when the scan mode signal is enabled at the node 410 and the scan enable signal is applied to the node 406, the output of the logical OR gates 424, 428, and 434 will be at a logic high level. Thus, the output of the logical AND gate 432 will be at a logic high level at the node 436. If the MBIST Mode signal is at a logic low level at the node 408, the output of the logical AND gate 420 will also be at a logic high level at the node 426. In this scenario (scan mode), both the functional clock gate 412 and the MBIST clock gate 416 may produce output clock signals (functional clock signal at the node 414 and MBIST clock signal at the node 418, respectively).

However, if the MBIST mode signal at the node 408 is at a logic high level, the inverter 422 causes the signal at the first input of the logical AND gate 420 will be at a logic low level. As a result, the signal at the node 426 at the output of the logical AND gate 420 may be at logic low level, disabling the functional clock gate 412. The logic table for the operation of the functional clock and the MBIST clock is shown below in Table 1.

TABLE 1

Logic table of operating modes.

| | Functional Mode | MBIST Mode | Scan Mode | Scan-Capture Portion of Scan Mode |
| --- | --- | --- | --- | --- |
| Functional Clock | ON | OFF | ON | Mutually Exclusive (Functional or NOT MBIST = toggle) |
| MBIST Clock | OFF | ON | ON | Mutually Exclusive (Functional or NOT MBIST = toggle) |

In the illustrated examples, the clock signals may be used to sequentially latch one or more values into a scan chain. This approach involves scanning test patterns into internal circuitry within a memory device under test. The latches or flip-flops within the the device may be modified to allow them to function both as stimulus and observation points (or scan cells) during test, while performing their intended functional role during operation.

In an example, the scan cells may be linked to form scan chains that operate like big shift registers when the circuit is put in to a test mode. In one example, external automatic test equipment may deliver a test pattern, which may be loaded into the memory, clocked into the chain, and then the captured data may be shifted out. The captured test chain may then be compared to an expected response to verify mismatches, which may indicate defects. Such mismatches or detected defects may be stored in memory or otherwise logged for further evaluation.

In one example, a stuck-at test may be performed to check each node location in the design for a stuck-at-one or stuck-at-zero logic behavior. In another example, an at-speed test may be performed to detect timing issues, such as slow-to-rise or slow-to-fall transition faults. In still another example, path delays may be determined for targeted timing-critical paths to verify that the critical paths do not have timing problems. Other tests can also be performed.

Figure 5:
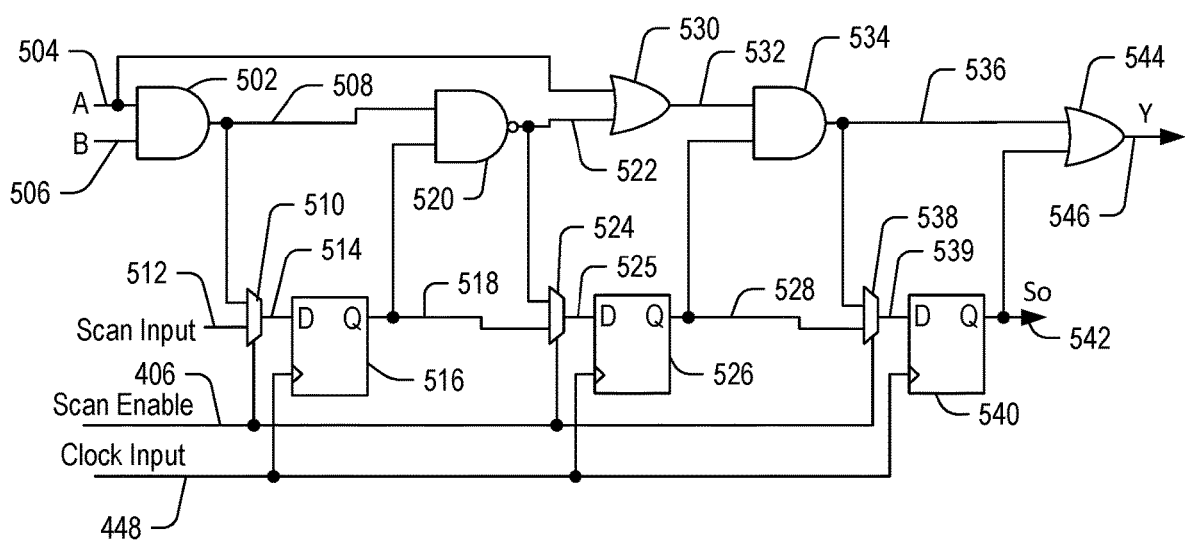
FIG. 5 depicts a scan chain circuit including a plurality of scan cells that can receive a selected clock signal to scan test patterns, in accordance with certain embodiments of the present disclosure.

FIG. 5 depicts a scan chain circuit 500 including a plurality of scan cells that can receive a selected clock signal to scan test patterns, in accordance with certain embodiments of the present disclosure. The scan chain circuit 500 may be an example of the latches 342, 346, and 348 and associated multiplexer circuitry depicted in FIG. 3, for example. In the examples of FIGS. 2-4, the scan chain circuit 500 may be part of the integrated memory device and may be configured to receive the functional clock signal, the MBIST clock signal, the PLL clock signal, the slow clock signal, or any combination thereof. During functional modes of operation, some of the logic circuitry, such as the multiplexer circuits may be disabled.

In the example of FIG. 5, the circuit 500 may include a logical AND gate 502 including a first input coupled to a node 504, a second input coupled to a node 506, and an output coupled to a node 508. The circuit 500 may further include a multiplexer 510 including a first input coupled to the node 508, a scan input node 512, a control input coupled to a node 406, and an output coupled to a node 514. The circuit 500 may include a latch 516 including a first input coupled to the node 514, a clock input coupled to the node 448, and an output coupled to a node 518.

The circuit 500 may include a logical NAND gate 520 including a first input coupled to the node 508, a second input coupled to the node 518, and an output coupled to a node 522. The circuit 500 may further include a multiplexer 524 including a first input coupled to the node 522, a second input coupled to the node 518, a control input coupled to the node 406, and an output coupled to a node 525. The circuit 500 may further include a latch 526 including a first input coupled to the node 525, a clock input coupled to the node 448, and an output coupled to a node 528.

The circuit 500 may include a logical OR gate 530 including a first input coupled to the node 504, a second input coupled to the node 522, and an output coupled to a node 532. The circuit 500 may also include a logical AND gate 534 including a first input coupled to the node 532, a second input coupled to the node 528, and an output coupled to a node 536. The circuit 500 may also include a multiplexer 538 including a first input coupled to the node 536, a second input coupled to the node 528, and an output coupled to a node 539. Further, the circuit 500 may include a latch 540 including an input coupled to the node 539, a clock input coupled to the node 538, and an output node 542 to provide a scan chain output signal (So). The circuit 500 may further include a logical OR gate 544 including a first input coupled to the node 536, a second input coupled to the node 542, and an output node 546 configured to provide a functional output signal.

In this example, when the scan enable signal is at a logic low level, the multiplexers 510, 524, and 536 ignore the signal at the scan input, and the signal at the nodes 508, 522, and 536 are stored in the latches 516, 526, and 540, respectively. In some embodiments, the clock signal at the clock input node 448 can be a slow clock or a PLL clock. In other embodiments, the clock signal at the clock input node 448 could be the functional clock, the MBIST clock, or another clock signal, depending on the implementation.

It should be appreciated that the illustrated example of the circuit 500 is provided for illustrative purposes only, and that the particular scan chain circuitry can vary based on the implementation. Other embodiments are also contemplated.

FIGS. 6A-6C depict timing diagrams of various signals of an OCC circuit during a functional mode, a memory built-in self-test mode, and a scan mode, respectively, in accordance with certain embodiments of the present disclosure. In FIG. 6A, the timing diagram 600 depicts signals at the various inputs and nodes of the circuit 400 in FIG. 4 are shown. In the illustrated example, a scan enable signal at the node 406 is at a logical low level, the functional or NOT MBIST signal at the node 404 is at a logic high level, the test clock signal (at a control input (not shown) of the multiplexer 442 in FIG. 4) is zero, and the BIST clock (at a control input (not shown) of the multiplexer 446 in FIG. 4) is also zero, providing the PLL clock signal at the node 438 to the node 448. The MBIST mode at the node 408 is at a logic zero level, which is inverted and provided as a logic high signal at the input of the logical AND gate 420. Further, the functional or NOT MBIST signal at the node 404 is at a logic high level, so the output of the logical OR gate 424 is at a logic high level. Thus, both inputs to the logical AND gate 420 are at logic high levels, and the logical AND gate 420 produces a logic high signal to enable the functional clock gate 412. In this example, the functional clock gate 412 is operational and is providing a functional clock at the node 414. In contrast, the inverter 430 flips the value of the functional and NOT MBIST signal to a zero value and, since the scan enable node 406 is at a logic low level, the logical OR gate 428 produces a zero value, so at least one of the inputs to the logical AND gate 432 is at a logic low level, causing the logical AND gate 432 to produce a logic low level signal at the node 436, disabling the MBIST clock gate 416.

In FIG. 6B, the timing diagram 610 depicts the various signals during a built-in self-test mode. In this example, the scan enable signal at the node 406 is at a logical low level, the functional or NOT MBIST signal at the node 404 is also at a logic low level, the test clock signal (at a control input (not shown) of the multiplexer 442 in FIG. 4) is at a logic high level (e.g., "1"), and the BIST clock (at a control input (not shown) of the multiplexer 446 in FIG. 4) is also at a logic high level, providing the slow clock signal at the node 438 to the node 448.

In this example, the MBIST Mode signal at the node 408 is at a logic high level, and the inverter 422 inverts the signal to provide a logic low level signal to one of the inputs of the logical AND gate 420, producing a logic low level signal at the node 426 to disable the functional clock gate 412. Further, the MBIST Mode signal may cause the logical OR gate 434 to apply a logic high signal to one of the inputs of the logical AND gate 432. The functional or NOT MBIST signal at the node 404 is at a logic low level, which is inverted by the inverter 430 to provide a logic high signal to one of the inputs of the logical OR gate 428, which provides a logic high signal to the logical AND gate 432. Since both inputs to the logical AND gate 432 are at logic high levels, the logical AND gate 432 provides a logic high level signal to the node 436, enabling the MBIST clock gate 416. Further, the MBIST clock gate 416 provides the MBIST clock signal to the node 418.

In the scan mode depicted in FIG. 6C, the signal scan enable signal at the node 406 is at a logic high level during a scan shift portion of the scan operation and at a logic low level during a scan capture portion of the scan operation. The functional or NOT MBIST signal at the node 404 is at a logic high level during scan shift portions of the scan operation and during one of the scan capture operations. During the second of the scan capture operations, the functional or NOT MBIST signal toggles to a logic low level and then returns to the logic high level. In this example, the test clock signal (at a control input (not shown) of the multiplexer 442 in FIG. 4) is at a logic low level (e.g., "0"), and the BIST clock (at a control input (not shown) of the multiplexer 446 in FIG. 4) is also at a logic low level, providing the PLL clock signal at the node 438 to the node 448.

In this example, both of the functional clock signal at the node 414 and the MBIST clock signal at the node 418 are active throughout most of the scan operation. During a first scan capture operation, generally indicated at 622, the scan enable signal transitions from a logic high level to a logic low level at the node 406. Since the function or NOT MBIST signal at the node 404 is at a logic high level and the MBIST mode signal at the node 408 is at a logic low level, the signals at the inputs of the logical AND gate 420 are both at logic high levels, allowing the logical AND gate 420 to continue to provide a logic high signal at the node 426 to enable the functional clock gate 412. This produces the functional clock signal within the scan capture window 622. At the same time, the MBIST clock signal is held at a logic low level because logic low level of the scan enable signal at the node 406 coupled with the logic high level of the functional or NOT MBIST signal at the node 404 (inverted by the inverter 430) produces logic low level signals at both inputs of the logical OR gate 428. This produces a logic low signal at one of the inputs of the logical AND gate 432, which produces a logic low signal at the node 436, disabling the MBIST clock gate 416. When the scan shift signal returns to a logic high level, the MBIST clock signal is restored.

During the scan capture window 624, the functional or NOT MBIST signal at the node 404 transitions from a logic high level to a logic low level (as generally indicated at 626). Since both the node 404 and the node 406 are at logic low levels, the output of the logical OR gate 424 is at a logic low level. This pulls the output signal at the node 426 to a logic low level, disabling the functional clock gate 412 so that the functional clock signal at the node 414 is held at a logic low level. At the same time, the inverter 430 inverts the logic low signal at the node 404, and both inputs to the logical AND gate 432 remain at a logic high level. Thus, the signal at the node 436 is at a logic high level, enabling the MBIST clock gate 416 to produce the MBIST clock signal at the node 418. Both clock signals resume when the scan enable signal at the node 406 returns to a logic high level, whether or not the functional or NOT MBIST signal transitions back to a logic high level.

Thus, during scan mode (i.e., when the scan mode signal is at a logic high level at the node 410 and when the scan enable signal is at a logic high level at the node 406), both the functional clock signal and the MBIS clock signal are provided. To reduce static timing analysis and physical design constraints, to eliminate masking of timing violations, and to avoid clock balancing circuitry, the MBIST clock or the functional clock may be selectively disabled (by toggling the scan enable signal at the node 406 and the functional or NOT MBIST signal at the node 404) during the scan capture portion of the scan operation.

The toggling of the signals allows for the two clocks to be used simultaneously within the scan shift operations and to be selectively disabled during the scan capture operations. This saves or eases static timing analysis efforts and physical design constraints, in part, because it eliminates the need to balance functional and MBIST clocks. Additionally, the functional clock (memory) to MBIST logic does not need to be time closed. Furthermore, during stuck-at or at-speed scan operations, false paths (launch from functional clock to capture on MBIST clock) will not be exercised. Moreover, the design eliminates the need to mask paths during various operations, making for more efficient use of automatic test pattern generation tools. Other advantages are also possible.

Figure 7:
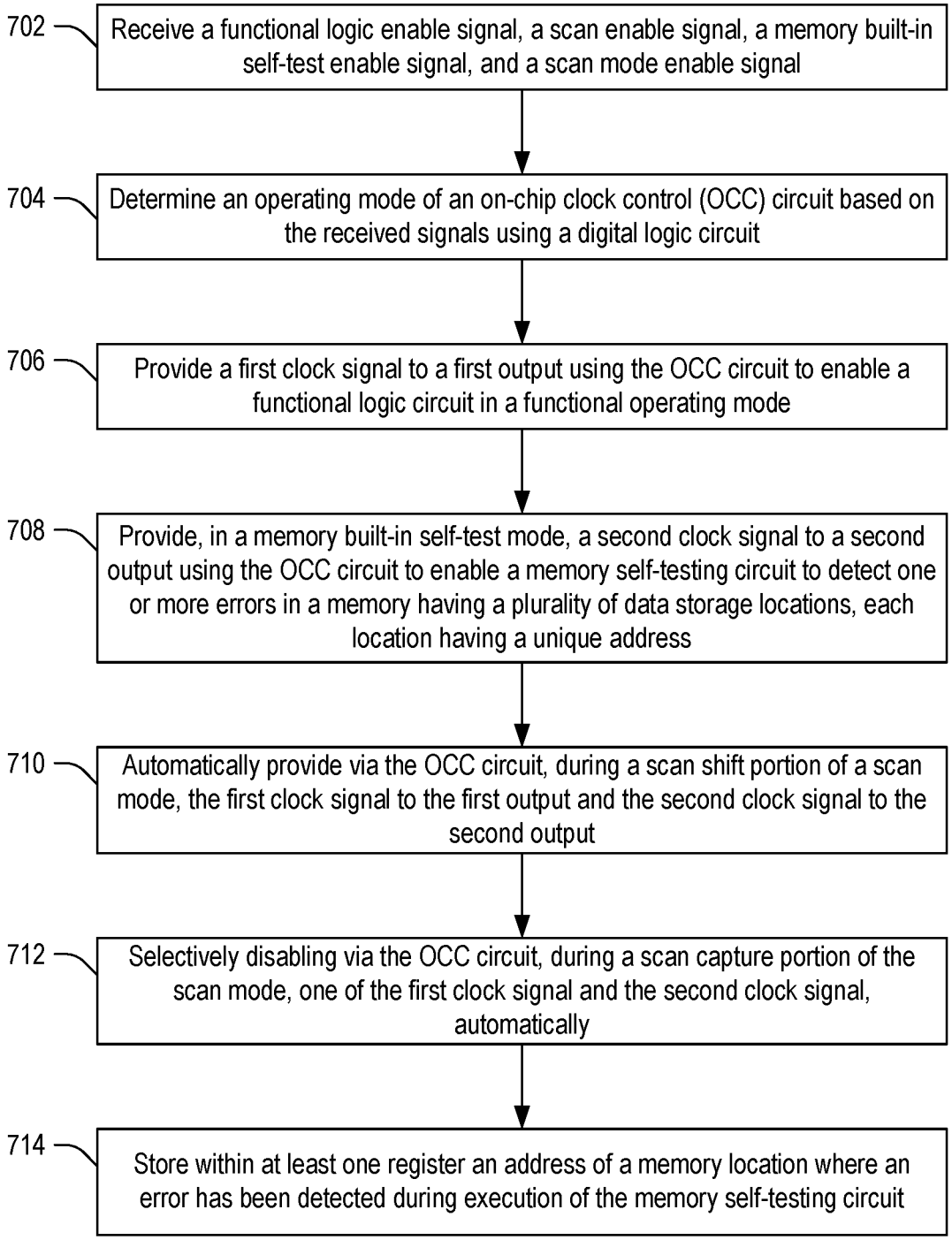
FIG. 7 depicts a flow diagram of a method of providing efficient clocking for a test memory interface, in accordance with certain embodiments of the present disclosure.

FIG. 7 depicts a flow diagram of a method 700 of providing efficient clocking for a test memory interface, in accordance with certain embodiments of the present disclosure. At 702, the method 700 may include receiving a functional logic enable signal, a scan enable signal, a memory built-in self-test enable signal, and a scan mode enable signal. The signals may be received at an OCC circuit configured to provide efficient clocking for testing a memory interface.

At 704, the method 700 can include determining an operating mode of the OCC circuit based on the received signals using a digital logic circuit. In an example, one or more of the received signals may configure the OCC circuit for a functional operating mode, an MBIST mode, a scan shift mode, and a scan capture mode.

At 706, the method 700 may include providing a first clock signal to a first output using the OCC circuit to enable a functional logic circuit in a functional operating mode. At 708, the method 700 can include providing, in a memory built-in self-test mode, a second clock signal to a second output using the OCC circuit to enable a memory self-testing circuit to detect one or more errors in a memory having a plurality of data storage locations, each location having a unique address.

At 710, the method 700 may include automatically providing via the OCC circuit, during a scan shift portion of a scan mode, the first clock signal to the first output and the second clock signal to the second output. At 712, the method 700 can include selectively disabling via the OCC circuit, during a scan capture portion of the scan mode, one of the first clock signal and the second clock signal, automatically.

At 714, the method 700 may include storing within at least one register an address of a memory location where an error has been detected during execution of the memory self-testing circuit.

Although the present invention has been described with reference to preferred embodiments, workers skilled in the art will recognize that changes may be made in form and detail without departing from the scope of the invention.

What is claimed is:

1. An integrated circuit comprising:
  a memory having a plurality of data storage locations, each location having a unique address;
  a memory self-testing circuit configured to be selectively enabled to detect one or more errors in the memory;
  a test output including at least one register capable of storing an address of a memory location where an error has been detected during execution of the memory self-testing circuit; and
  an on-chip clock controller (OCC) circuit including a first output coupled to the memory to provide a first clock signal to enable a functional logic circuit of the memory in a functional operating mode and a second output coupled to the memory self-testing circuit to provide a second clock signal according to a mode of operation:

in a scan mode, the OCC circuit configured to enable the first clock signal and the second clock signal;
during a scan shift portion of the scan mode, the OCC circuit configured to provide the first clock signal to the first output and the second clock signal to the second output; and
during a scan capture portion of the scan mode, the OCC circuit configured to selectively disable the second clock signal.

2. The integrated circuit of claim 1, further comprising the OCC circuit further configured to enable the first clock signal and disable the second clock signal to enable a functional mode of operation of the functional logic circuit.

3. The integrated circuit of claim 2, the OCC circuit further configured to disable the first clock signal and enable the second clock signal to enable a memory built-in self-test mode of the memory self-testing circuit.

4. The integrated circuit of claim 1, the OCC circuit further comprising an integrated clock gating cell including:
a first input to receive an enable signal;
a clock input to receive a time-varying signal; and
an output to provide a gated clock signal according the time-varying signal.

5. The integrated circuit of claim 4, the OCC circuit further comprising a multiplexer including:
a first input to receive the first clock signal;
a second input to receive the second clock signal, the second clock signal being faster than the first clock signal;
a select input to receive clock selection signal; and
a multiplexer output configured to provide one of first clock signal and the second clock signal to the clock input of the integrated clock gating cell.

6. The integrated circuit of claim 1, further comprising:
a first input to receive a functional logic enable signal;
a second input to receive a scan enable signal;
a third input to receive a memory built-in self-test enable signal;
a fourth input to receive a scan mode enable signal; and
a digital logic circuit coupled to the first, second, third, and fourth inputs to selectively enable at least one of a functional logic circuit and a memory built-in self-test logic circuit.

7. The integrated circuit of claim 6, the OCC circuit further comprising:
a first multiplexer including a first input to receive a gated version of the first clock signal, a second input to receive the second clock signal, and an output, the second clock signal being faster than the first clock signal;
a second multiplexer including a first input to receive the first clock signal, a second input coupled to the output of the first multiplexer, and an output;
a functional clock gate including an enable input, a clock input coupled to the output of the second multiplexer, and an output configured to provide the first clock signal;
a memory built-in self-test clock gate including an enable input, a clock input coupled to the output of the second multiplexer, and an output configured to provide the second clock signal; and
the digital logic circuit coupled to the enable input of the functional clock gate and the memory built-in self-test clock gate to selectively enable at least one of the first clock signal and the second clock signal.

8. An integrated circuit comprising:
a memory having a plurality of data storage locations, each location having a unique address;
a memory self-testing circuit configured to be selectively enabled to detect one or more errors in the memory;
an on-chip clock controller (OCC) circuit including a first output to provide a first clock signal to the memory to enable and disable a functional circuit of the memory and a second output to provide a second clock signal to the memory self-testing circuit to enable and disable a memory testing function, the OCC circuit configured to enable both the first clock signal and the second clock signal during a scan shift portion of a scan mode operation and selectively disable the second clock signal during a scan capture portion of the scan mode operation; and
an output including at least one register capable of storing an address of a memory location where an error has been detected during execution of the memory self-testing circuit.

9. The integrated circuit of claim 8, further comprising:
functional logic circuitry responsive to the first clock signal during functional operation; and
built-in self-test logic circuitry responsive to the second clock signal during a test operating mode.

10. The integrated circuit of claim 8, further comprising the OCC circuit configured to disable the first clock signal and enable the second clock signal during a memory built-in self-test mode.

11. The integrated circuit of claim 10, further comprising the OCC circuit configured to enable the first clock signal and disable the second clock signal during a functional mode of operation of the memory.

12. The integrated circuit of claim 8, the OCC circuit further comprising an integrated clock gating cell including:
a first input to receive an enable signal;
a clock input to receive a time-varying signal; and
an output to provide a gated clock signal according the time-varying signal.

13. The integrated circuit of claim 12, the OCC circuit further comprising a multiplexer including:
a first input to receive the first clock signal;
a second input to receive the second clock signal, the second clock signal being faster than the first clock signal;
a select input to receive clock selection signal; and
a multiplexer output configured to provide one of first clock signal and the second clock signal to the clock input of the integrated clock gating cell.

14. The integrated circuit of claim 8, further comprising the OCC circuit including unbalanced clock signals including the first clock signal and the second clock signal.

15. The integrated circuit of claim 8, the OCC circuit further comprising:
a first multiplexer including a first input to receive a gated version of the first clock signal, a second input to receive the second clock signal, and an output;
a second multiplexer including a first input to receive the first clock signal, a second input coupled to the output of the first multiplexer, and an output;
a functional clock gate including an enable input, a clock input coupled to the output of the second multiplexer, and an output configured to provide the first clock signal;

a memory built-in self-test clock gate including an enable input, a clock input coupled to the output of the second multiplexer, and an output configured to provide the second clock signal; and the digital logic circuit coupled to the enable input of the functional clock gate and the memory built-in self-test clock gate to selectively enable at least one of the first clock signal and the second clock signal.

16. A method comprising:

determining an operating mode of an on-chip clock control (OCC) circuit based on signals received at a plurality of inputs using a digital logic circuit of the OCC circuit, the OCC circuit including a first output configured to selectively provide a first clock signal to a functional logic circuit of a memory and the OCC circuit including a second output configured to selectively provide a second clock signal to a memory self-testing circuit;

in a functional operating mode, providing the first clock signal to the first output to enable the functional logic circuit;

in a memory built-in self-test mode, providing the second clock signal to the second output to enable the memory self-testing circuit to detect one or more errors in the memory;

in a scan mode, providing via the OCC circuit the first clock signal to the first output and the second clock signal to the second output during a scan shift portion of the scan mode; and during a scan capture portion of the scan mode, disabling, via the OCC circuit, the second clock signal.

17. The method of claim 16, further comprising storing within at least one register an address of a memory location where an error has been detected during execution of the memory self-testing circuit.

18. The method of claim 16, further comprising enabling the first clock signal and the second clock signal when the scan capture portion of the scan mode ends.

19. The method of claim 16, further comprising:

receiving a functional logic enable signal at a first input of the OCC circuit;

receiving a scan enable signal at a second input of the OCC circuit;

receiving a memory built-in self-test enable signal at a third input of the OCC circuit;

receiving a scan mode enable signal at a fourth input of the OCC circuit; and the determining the operating mode includes applying the first, second, third, and fourth inputs to digital logic circuit to determine the operating mode.

20. The method of claim 16, further comprising controlling a multiplexer of the OCC circuit to selectively provide one of the first clock signal and the second clock signal to a clock input of an integrated clock gating circuit.

* * * * *